United States Patent
Higgins

(10) Patent No.: US 8,729,906 B2
(45) Date of Patent: May 20, 2014

(54) MONITORING PARTIAL DISCHARGE IN HIGH VOLTAGE SYSTEMS

(75) Inventor: Simon Higgins, Johannesburg (ZA)

(73) Assignee: Eskom Holdings SOC Limited, Johannesburg (ZA)

(*) Notice: Subject to any disclaimer, the term of this patent is extended or adjusted under 35 U.S.C. 154(b) by 373 days.

(21) Appl. No.: 13/060,044

(22) PCT Filed: Jul. 22, 2009

(86) PCT No.: PCT/IB2009/053176
§ 371 (c)(1),
(2), (4) Date: Apr. 28, 2011

(87) PCT Pub. No.: WO2010/023570
PCT Pub. Date: Mar. 4, 2010

(65) Prior Publication Data
US 2011/0193563 A1    Aug. 11, 2011

(30) Foreign Application Priority Data
Aug. 25, 2008 (ZA) ............................. 2008/07366

(51) Int. Cl.
*G01R 31/02* (2006.01)

(52) U.S. Cl.
USPC .................................. 324/551; 324/76.11

(58) Field of Classification Search
CPC .... G01R 31/08; G01R 31/083; G01R 31/085; G01R 31/12
See application file for complete search history.

(56) References Cited

U.S. PATENT DOCUMENTS

| 3,813,667 | A | 5/1974 | Smith | |
|---|---|---|---|---|
| 6,243,652 | B1* | 6/2001 | Fawcett et al. | 702/65 |
| 7,532,012 | B2* | 5/2009 | Cern | 324/536 |
| 2011/0248721 | A1* | 10/2011 | Higgins | 324/537 |

FOREIGN PATENT DOCUMENTS

| EP | 0510795 A2 | 10/1992 |
|---|---|---|
| JP | 2-261004 | 10/1990 |
| JP | 2008-51708 | 3/2008 |

OTHER PUBLICATIONS

International Search Report for Application No. PCT/IB2009/053176, dated Dec. 8, 2009.

* cited by examiner

*Primary Examiner* — Vinh Nguyen
(74) *Attorney, Agent, or Firm* — Nelson Mullins Riley & Scarborough LLP; Anthony A. Laurentano

(57) ABSTRACT

A method and device for monitoring partial discharges in high voltage electrical or power systems is provided. A low trigger level and a high trigger level electrical pulse amplitude levels are defined. At least one phase of the electrical system is monitored for an occurrence of a pulse within a defined minor time frame. A peak amplitude of a pulse occurring in the electrical system within the minor time frame is detected. It is determined if the detected peak amplitude of the pulse exceeds the lower and higher trigger levels. A pulse number is assigned to the pulse if the peak amplitude of the pulse exceeds the trigger levels. The pulse is captured if the pulse number associated with the pulse is less than a predetermined pulse number threshold in the minor time frame. The captured pulses are stored in a memory.

10 Claims, 5 Drawing Sheets

MONITORING PARTIAL DISCHARGE IN HIGH VOLTAGE SYSTEMS

RELATED APPLICATIONS

This application is a 35 U.S.C. 371 national stage filing of International Application No. PCT/IB2009/053176, filed Jul. 22, 2009, which claims priority to South Africa Patent Application No. 2008/07366 filed on Aug. 25, 2008 in South Africa. The contents of the aforementioned applications are hereby incorporated by reference.

BACKGROUND OF THE INVENTION

THIS invention relates to high voltage electrical or power systems and in particular to a method and device for monitoring partial discharges in high voltage electrical or power systems.

The insulation of high voltage, typically three phase, electrical or power systems are often susceptible to impulses which occur therein. These impulses are typically due to discharges across inhomogeneous boundaries within the high voltage electrical or power system, such as gaps in insulation of cables, or the like. It will be appreciated that these discharges are often partial discharges within the high voltage electrical insulation.

It is therefore an object of the present invention at least to provide a method and a system to monitor or detect partial discharges occurring in high voltage three phase electrical or power systems.

SUMMARY OF THE INVENTION

According to a first aspect of the invention there is provided a method of monitoring partial discharges occurring in an electrical system, the method comprising:
 defining a low trigger level and a high trigger level, the low and the high trigger levels being amplitude levels for electrical pulses, wherein the high trigger level is a higher amplitude than the low trigger level;
 defining a minor time frame period;
 monitoring at least one phase of the electrical system for an occurrence of a pulse within the minor time frame;
 detecting a peak amplitude of a pulse occurring in the electrical system within the minor time frame;
 determining if the detected peak amplitude of the pulse exceeds the lower trigger level and/or the higher trigger level;
 assigning a pulse number to the pulse if the peak amplitude of the pulse exceeds the lower trigger level and/or the higher trigger level;
 capturing the pulse, or information associated therewith, if the pulse number associated with the pulse is less than a predetermined pulse number threshold in the minor time frame;
 applying a moving time trigger offset, such that:
  if a pulse exceeds the low trigger level but not the high trigger level and the pulse number equals a predetermined number of pulses then recording the time value within the minor time frame at which this occurs and ceasing to capture pulses exceeding the low trigger level but not the high trigger level until after this time value in a following minor time frame; and
  resetting the time value of the moving time trigger offset to zero and starting to capture pulses for the next minor time frame for pulses exceeding only the low trigger level after the moving time trigger offset value equals the value of the minor time frame; and
 storing the captured pulses in a memory device.

The method may comprise selecting the pulse number threshold, the pulse number threshold being a maximum number of pulses to be captured in the minor time frame.

It will be appreciated that assigning a pulse number to the pulse may comprise incrementing a pulse number counter thereby to keep track of the number of pulses exceeding the lower trigger level and/or the higher trigger level in the minor time.

The method may comprise capture pulses on a next cycle at a point at which the moving time trigger offset stopped on a previous cycle.

The method may comprise capturing pulses, or information associated therewith, as low-level events or high-level events, wherein low-level events are deemed to occur if the peak amplitude of the pulse exceeds the lower trigger level but not the higher trigger level and wherein the high-level event is deemed to occur if the peak amplitude of pulse exceeds both low and high trigger levels respectively.

The method may further comprise:
 starting a timer and storing a peak amplitude and sign of a previous pulse if a peak amplitude of a current pulse at a sample point falls below that of a previous sample; and
 resetting the timer and starting a new timeslice period, if during a timeout period, the peak amplitude of a current pulse is greater than the stored peak amplitude of the previous pulse.

According to a second aspect of the invention, there is provided a device for monitoring and capturing partial discharges occurring in a three phase electrical system, the device comprising:
 a peak detector for detecting peak amplitudes of pulses occurring in the electrical system;
 a trigger module arranged to:
  determine if the detected peak amplitude of the pulse exceeds a lower trigger level and/or the higher trigger level, the low and the high trigger levels being amplitude levels for electrical pulses, wherein the high trigger level is a higher amplitude than the low trigger level;
  assign a pulse number to the pulse if the peak amplitude of the pulse exceeds the lower trigger level and/or the higher trigger level;
  capture the pulse, or information associated therewith, if the pulse number associated with the pulse is less than a predetermined pulse number threshold in a minor time frame
 and;
 a database in which a plurality of pulses, or information associated therewith, captured by the trigger module is stored.

The device may comprise a processor arranged at least to apply a moving time trigger offset. It follows that the processor may be configured to:
 record a time value within the minor time frame at which the peak amplitude of the pulse exceeds the low trigger level but not the high trigger level and the pulse number equals the predetermined pulse number threshold;
 cease capturing pulses, or information associated therewith, for those pulses with peak amplitudes exceeding the low trigger level but not the high trigger level until after the time value in a following minor time frame; and
 reset the time value of the moving time trigger offset to zero and capturing pulses for the next minor time frame for pulses having peak amplitudes exceeding only the low trigger level after the moving time trigger offset value equals the value of the minor time frame.

The device may optionally comprise a co-ordinate converting module arranged to convert a vector from Cartesian co-ordinates to polar co-ordinates.

DESCRIPTION OF PREFERRED EMBODIMENTS

In the following description, for purposes of explanation, numerous specific details are set forth in order to provide a thorough understanding of an embodiment of the present disclosure. It will be evident, however, to one skilled in the art that the present disclosure may be practiced without these specific details.

Figure 1:
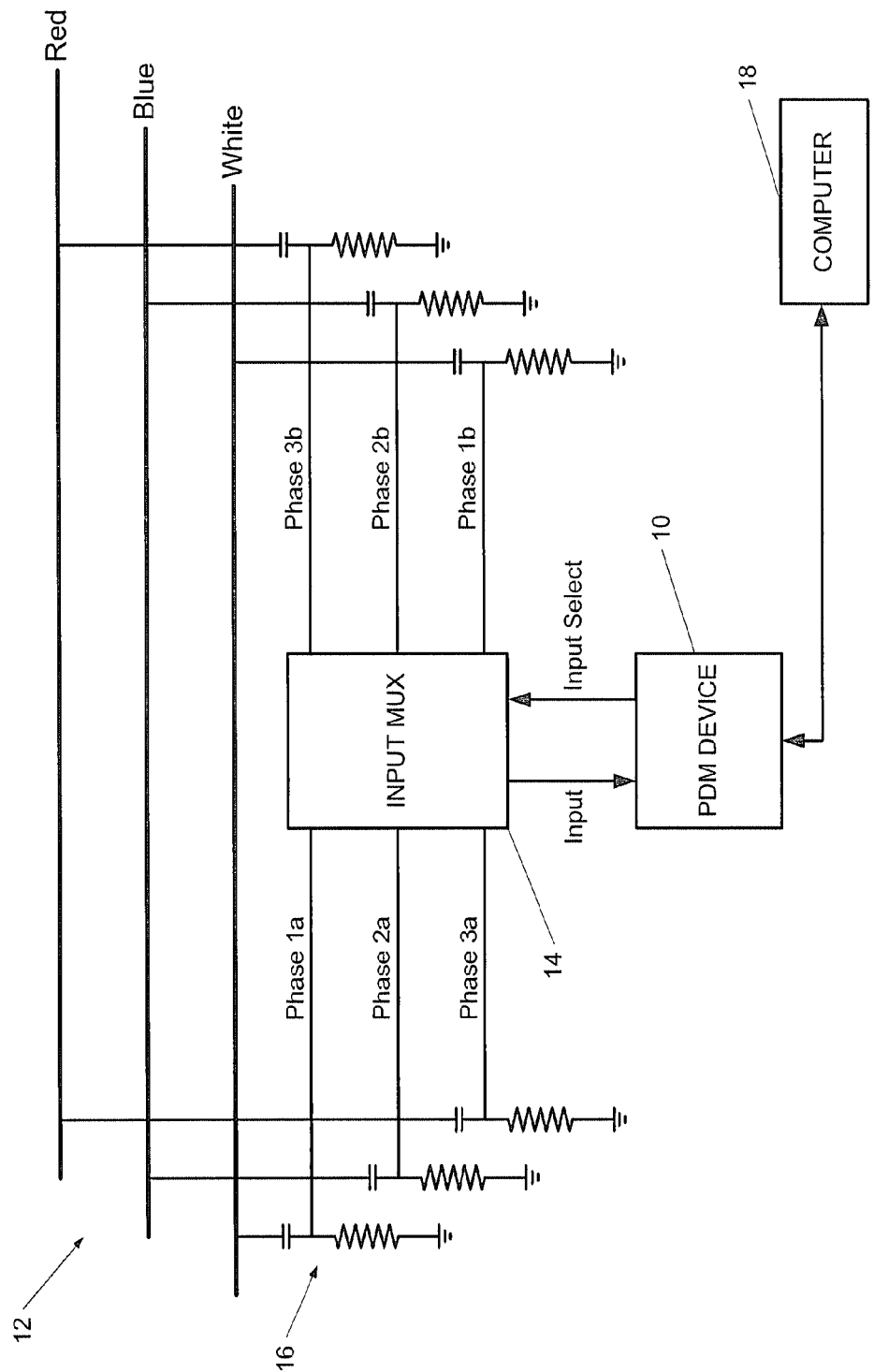
FIG. 1 shows a schematic interface diagram of a partial discharge monitoring (PDM) device, in accordance with an example embodiment, interfacing with a high voltage three-phase electrical or power system.
Figure 2:
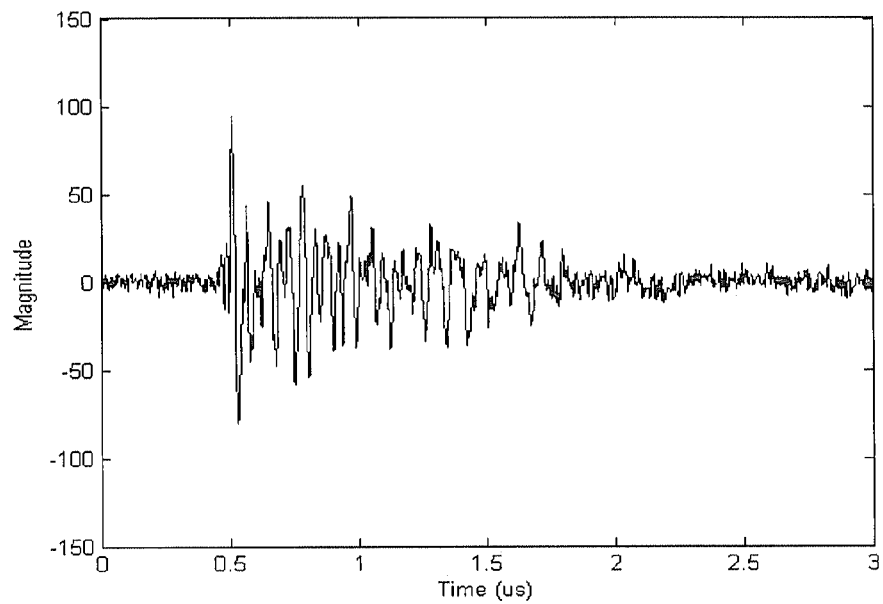
FIG. 2 shows a graphical representation of a typical discharge pulse.

Referring to FIG. 1 of the drawings, a partial discharge monitoring (PDM) device 10 is communicatively coupled to a high voltage electrical or power distribution system 12, for example a three-phase power supply distribution system, via an input multiplexor 14 to monitor the system 12 for partial discharge pulses of a similar type illustrated in FIG. 2. The multiplexor is in turn connected to the system 12 by way of a plurality of sensors 16. Each sensor 16 is typically in the form of a capacitor and a resistor to ground, or in other words a single pole high pass filter. In an example embodiment, a pair of sensors 16 is provided for each phase 1, 2 and 3 of the three-phase power system 12 such that there are six inputs to the multiplexor 14. A known distance separates the two sensors 16 per phase this allows an indication of position of the source by monitoring the direction of travel of a pulse.

Figure 3:
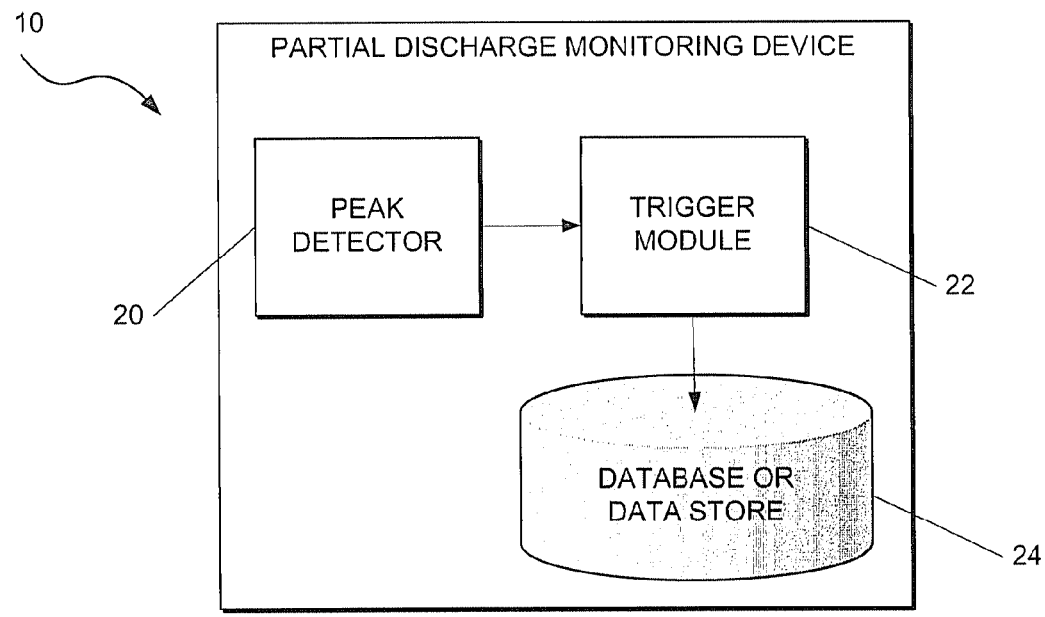
FIG. 3 shows a functional block diagram of a PDM device able to interface with one sensor of the system shown in FIG. 1.

An example embodiment of a partial discharge monitoring (PDM) device 10 for use with a single phase is shown in FIG. 3. It will be noted that the PDM device 10 is a single input module, which is typically arranged to receive an input from any one of the six sensors 16. The device 10 does not capture all the events in a mains cycle, but progressively builds up a picture of all the events in a cycle as will be described in more detail below.

For ease of explanation, two time frames are defined in this specification firstly a time slice, and secondly a minor time frame. A time slice is an 80 μs time frame which is the time resolution for display of data in a scatter plot generated by an attached computer. A minor time frame on the other hand is a 20 ms time frame, which is equivalent to one cycle at 50 Hz. It follows that a minor time frame typically consists of 250 time slices.

In the example embodiment, the pulse characteristics of the PDM device 10 include a maximum frequency of 250 MHz, a maximum pulse length of 4 μs and a minimum rise time around 10 ns.

Referring to FIG. 3 of the drawings, the PDM device 10 includes a plurality of components or modules which correspond to the functional tasks to be performed by the device 10. In this regard, "component" or "module" in the context of the specification will be understood to include an identifiable portion of code, computational or executable instructions, data, or computational object to achieve a particular function, operation, processing, or procedure. It follows that a component or module need not be implemented in software; a component or module may be implemented in software, hardware, or a combination of software and hardware. Further, the components or modules need not necessarily be consolidated into one device but may be spread across a plurality of devices.

In particular, the PDM device 10 includes a peak detector 20 for detecting peak amplitudes of pulses occurring in the electrical system 12. The peak detector 20 determines the maximum amplitude within the pulse and passes this along with a valid flag to a trigger module 22 of the PDM device 10 (described in greater detail below).

The peak detector 20 is in effect a peak tracking architecture. If the magnitude at a sample point falls below that of the previous sample then a timer will be started and the magnitude and sign of the previous sample are stored. If during a timeout period the current magnitude is greater than the stored value, then the magnitude and sign are stored, the timer is reset and a new timeout period started. When the timer times out, a valid peak shall be declared by asserting a peak valid flag.

The peak detector 20 thus detects the peaks of pulses and passes these onto the trigger module 22 of the PDM device 10 to which it is communicatively coupled.

The trigger module 22 is arranged to compare peak amplitudes of pulses occurring in the electrical system with a high trigger level and a low trigger level. These trigger levels are set within the device and can be reset from time to time by accessing the trigger module 22. In an example embodiment, the low trigger level may be 20 mV and the high trigger level may be 100 mV.

The device 10 is arranged to capture all pulses which have peak amplitudes above the high trigger level and is also arranged to capture a predetermined number of pulses which have peak amplitudes above the low trigger level but below the high trigger level.

It will be appreciated that capturing a pulse includes capturing information indicative or associated with the pulse.

The PDM device 10 also includes a memory in the form of a database or data store 24 in which the plurality of captured pulses are stored. The device 10 is arranged to apply a time trigger offset to the low trigger level. The trigger module 22 is therefore arranged to capture pulses on a next cycle at the point at which the time trigger offset stopped on the previous cycle.

Figure 4:
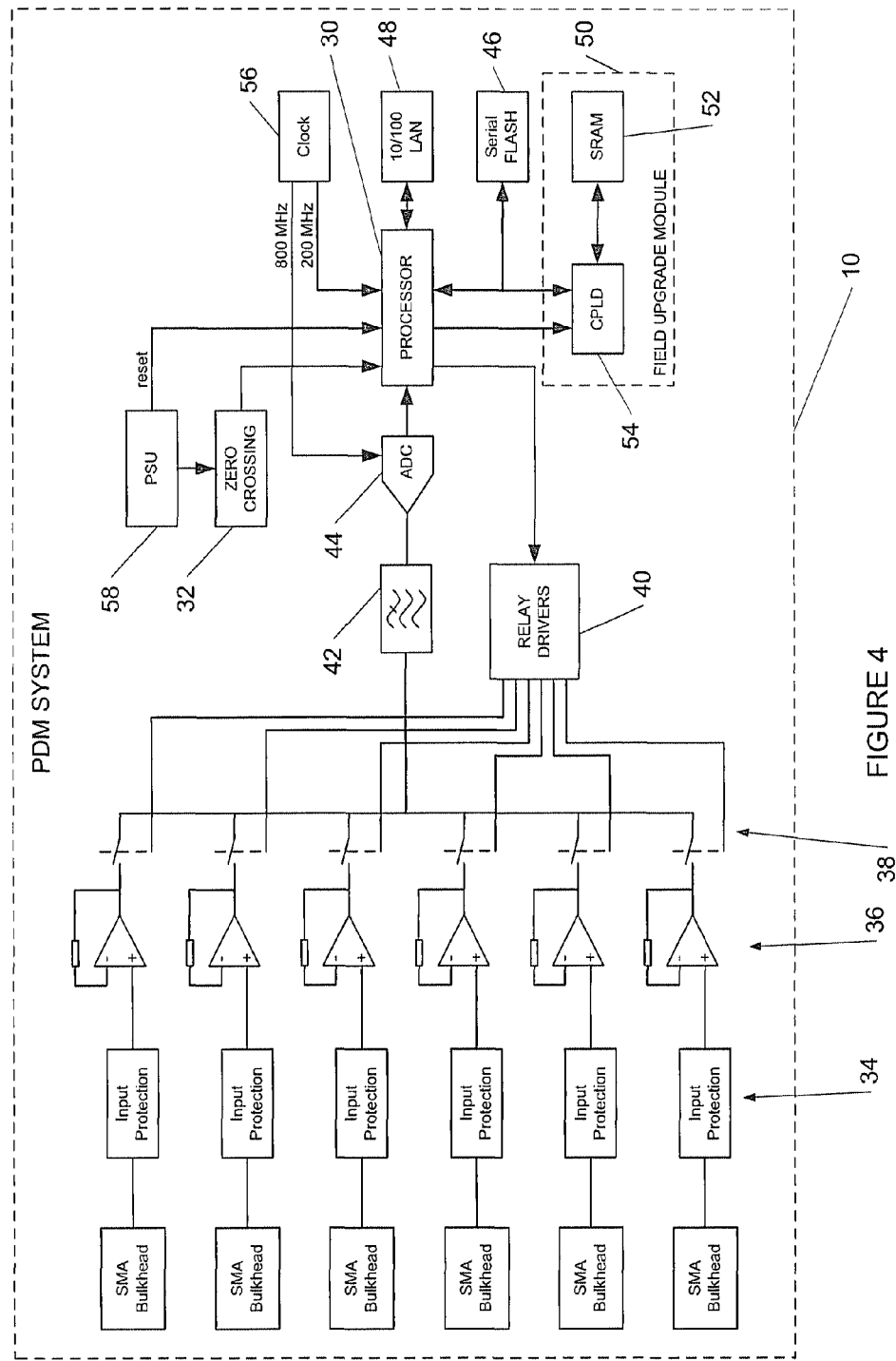
FIG. 4 shows a schematic block diagram of the PDM device of FIG. 3 in greater detail.
Figure 5:
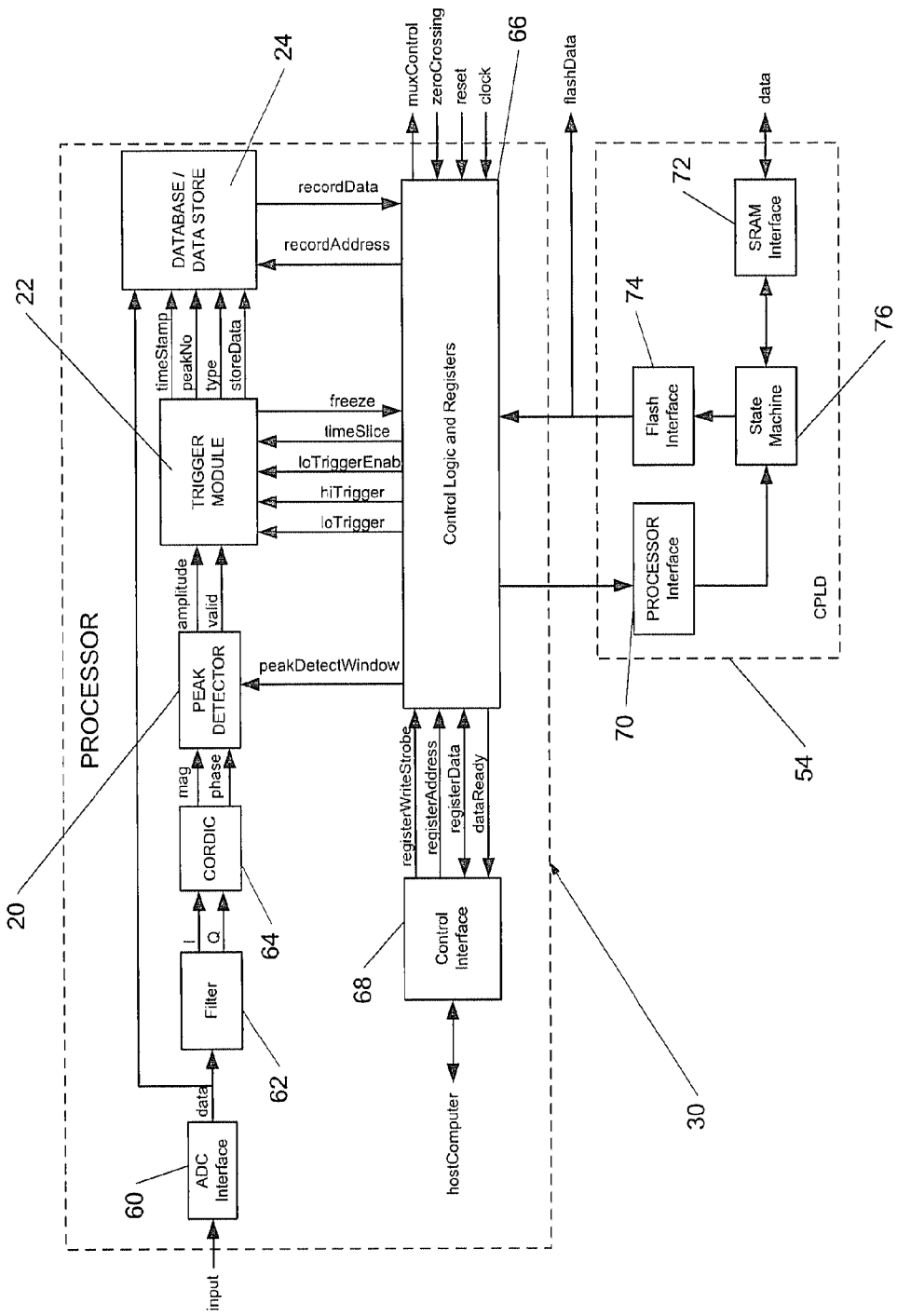
FIG. 5 shows a schematic interface diagram of a portion of the PDM device of FIG. 4 in greater detail.

Turning now to FIGS. 4 and 5 of the drawings, the PDM device 10 typically includes a processor 30 typically in the form of a field programmable gate array (FPGA). It will be noted that in one example embodiment the peak detector 20 and trigger module 22 are components or, modules provided in the processor 30.

The PDM device 10 is typically mains powered, thus a zero crossing detector 32 is included within the PDM device 10. The zero crossing module 32 provides a reference time for the minor time frame. Typically, only negative to positive transitions are detected.

In one example embodiment, the PDM device 10 is implemented as a single printed circuit board (PCB) containing all components as illustrated in FIG. 4. Instead, the PDM device 10 may be split between two or more PCBs for example one PCB containing the input protection 34, buffer amplifiers 36, relays 38 and relay driver 40 (all described below). The second PCB then would consist of the entire signal processing hardware.

As mentioned, the PDM device 10 includes input protection modules 34. The input protection modules 34 provide the electronics of the PDM device 10 both over-voltage and over-current protection from high-energy spikes on the inputs from the sensors 16. The input protection modules can typically withstand a fast 200 V transient.

The PDM device 10 further includes an analogue buffer or buffer amplifiers 36 to provide a high-input impedance at the interface to the electronics.

Due to the signal processing hardware having only one channel, it will be necessary to select one of the six inputs as the input to the signal processing hardware. This is done by way of the relays 38 and relay driver 40. In an example embodiment VHF relays are used as the switches.

It will be understood that the relay driver 40 converts control signals from the processor 30 to a level suitable for switching the relays 38.

The PDM device 10 typically includes an anti-alias filter 42 with following parameters for example:
Passband: 250 MHz
Passband ripple: ±0.5 dB
Stopband: ≥375 MHz
Stopband attenuation: 60 dB The PDM device 10 includes an analogue-to-digital converter (ADC) 44. The ADC 44 allows for sampling at 800 Msps. In practice this means that the PDM device 10 will be a 1 Gsps 8 bit device. It must be mentioned here that the sampling rate must be commensurate with the maximum frequency input and the minimum rise time. In general the maximum frequency content of a signal is no more than $0.4*F_s$ where $F_s$ is the sampling frequency. Thus for the PDM device 10, the minimum sampling frequency will be 625 MHz making the abovementioned sampling frequency of 800 MHz very suitable.

A serial flash 46 is non-volatile memory required to store the firmware data for the processor 30.

In the illustrated embodiment, the PDM device 10 includes a 10/100 Local Area Network (LAN) output 48.

A field upgrade module 50 may also be provided in the PDM device 10. The module 50 provides the functionality to enable an update of the firmware of the processor 30 in the field. The new program is typically transferred to unit via the LAN 48. The new data will be stored temporarily in SRAM 52, and once all the data has been transferred the complex programmable logic device (CPLD) 54 will undertake the re-programming of the serial FLASH 46.

It will be understood that a clock 56 is required, the clock 56 comprising two clocks i.e. a 800 MHz clock for ADC 44, and 200 MHz system clock for processor 30.

A power supply unit (PSU) 58 provides voltage conditioning to supply all the required DC voltages within the PDM device 10. The input to the PSU 58 is at a standard mains supply at 110V or 230V. In an example embodiment the PSU 58 provides the PDM device 10 with a wide reset signal.

Looking at the processor 30 in more detail with reference to FIG. 5, it will be noted that the processor 30 also includes a plurality of components or modules as hereinbefore described. In addition to the peak detector 20, trigger module 24, and database 24, the processor 34 also comprises an ADC interface 60 to interface with the ADC 44.

The ADC 44 provides some level of de-multiplexing to reduce the data rate to the processor 30. Typically this is a 2:1 de-mux, which means two samples are collected and transferred to the processor 30 in parallel, thus the data rate seen by the processor 30 is half that of the ADC sample rate. Having regard to the abovementioned sampling rate of 800 Msps, this means that the processor 30 will receive data at 400 Msps. However, in the present example embodiment the system clock rate of the processor 30 is unlikely to be at 400 MHz and is typically 200 MHz. Thus the ADC interface 60 provides a further level of de-multiplexing within the processor 30 so that the input to the remainder of the PDM device 10 will be at the system clock rate.

The processor 30 also includes a filter 62 to remove DC elements. Also, in order to determine magnitude and phase of the input signal on a sample-by-sample basis, the input data is typically converted into an analytical signal (complex).

It will be noted that the output of the filter 62 are the I and Q components of a complex signal.

The processor 30 includes a co-ordinate converting module 64. The co-ordinate converting module 64 is arranged to convert a vector from Cartesian co-ordinates to a polar co-ordinate form (magnitude and phase).

The peak detector module 20 as provided in the processor 30 was hereinbefore described in detail. The trigger module 22 on the other hand needs more explanation.

As an aside, it will be noted that the trigger levels are capable of being set by a user via a computer, however, default values are typically provided. In an example embodiment, the low level trigger can be used to enable capturing of all events in a minor time frame. It will be noted that in the context of the specification "event" will be understood to include the occurrence of a pulse. In this regard, a low-level event is deemed to occur if the pulse magnitude exceeds the lower trigger level but not the higher trigger level whilst a high-level event is deemed to occur if the pulse magnitude exceeds both trigger levels.

As mentioned, not all events but a predetermined number thereof is captured in a single minor time frame. In particular, a maximum value is captured. This can be any number from one upward. In this case, ten low level and ten high level events per cycle are captured. For high level events, once the maximum value is exceeded during a minor time frame, capture ceases until the start of the next minor time frame. The next capture starts at the beginning of the next minor time frame.

For low-level events, a trigger hold-off is typically provided to ensure that the capture within a cycle resumes where the capture in the previous cycle finished, having captured the ten events.

It is assumed that the final capture for both high and low level events within a minor time frame will finish at the end of the minor time frame irrespective of whether ten pulses have been captured or not.

An example of the above would be as follows. At the start of a minor time frame (20 mS) a timer is started. Any low level pulses, detected after the timer has started that exceed the low level trigger and do not exceed the high level trigger and that occur during this minor time frame are captured, up to a maximum number of pulses (for example 10 pulses).

If the maximum number of pulses are captured quickly, say in less than 20 ms, then capturing will cease before the end of the minor time frame and the relative time on the cycle which is represented by the timer value at which capturing ceases is recorded.

Capturing will only recommence for low level pulses during the next minor time frame, at the relative time, from the previous minor time frame, at which capturing ceased, that is the time recorded from the timer. The next pulse that occurs after this relative time offset, that exceeds the lower trigger level and not high level trigger, is then recorded.

This process is repeated, for the capturing of groups of 10 pulses, until the timer value equals the value of the length of a minor time frame. This is referred to as a moving time trigger offset.

Sometimes only a few pulses, say less than 10, will be captured when the timer value is very close to the value of the minor time frame. This is because at the end of the minor time frame capturing will cease, the timer is reset and starts again and pulse capture will only recommence when the lower trigger level is again exceeded.

For pulses exceeding the low and high level trigger, during a given minor time frame, the pulse that exceeds both the low and high level trigger is captured and stored repeatedly unless there are more than a maximum number of such pulses captured in the predetermined minor time frame (for example 20 ms). In the illustrated embodiment the maximum number of pulses to be captured that exceed the high trigger level is 10 per minor time frame. The difference between this scenario and the scenario described above is that once 10 pulses are captured no further pulses are captured until the next minor time frame. There is no moving time trigger offset applied to the capturing of pulses that exceed both the low and high trigger level.

In an example embodiment, the default low trigger level may roughly be 20 mV input level while a default high trigger level may roughly be 100 mV input level.

The trigger module 22 is arranged to compare the valid output from the peak detector 20 against the two mentioned trigger levels. The comparison against the low trigger level shall only occur if the low trigger enable signal is asserted.

If an event above the trigger levels has occurred then the record number, an indication as to whether the data is from the low trigger or the high trigger and a time-stamp is transferred to a database or data store 24 of the PDM device 10. In addition, a data store signal is asserted to start the storing of the raw data into an appropriate memory slot in the database 24. In an example embodiment, typically 4 μs worth of raw data encompassing the event is captured in the database 24. The data captured preferably also includes pre-trigger data in order to capture the rise time of the event. For example with a maximum rise time of 100 ns then ~150 ns of pre-trigger data is captured.

At the end of a minor time frame the captured data and stored data is optionally transferred to the host computer 18. It follows that the data transferred includes the time stamp, which will be the time slice within which the trigger event occurred, for each captured event. It must be noted at this point that the amount of data transferred at the end of each minor time frame is typically 64020 bytes equating to a data transfer rate of 25.608 Mbits/s. This calculation is based on the following parameters:

Pulse length: 4 μs,
Sampling rate: 800 Msps,
Data width: 1 byte per sample,
Number of events: 20,
Time stamp width: 1 byte.

This data rate of transfer therefore falls within the range of the LAN 48.

In preferred example embodiments, two record counters are maintained in the database 24, one for high-level events and the other for low-level events. When a counter for an event type reaches the maximum value (in this case ten, but can be any value from one upward) then no further events of that type shall be processed. In addition when the record counter for the low level events reaches the predetermined number or maximum value then the trigger hold off time held within a control logic and register module 26 (FIG. 5) shall be updated, so that in the next minor time frame the low level event processing can restart from the time that processing finished in the previous minor time frame. At the start of each minor time frame the record counters are optionally reset to zero. It will be appreciated that if an event exceeds both the low level trigger and the high level trigger then the event shall only be recorded as a high level event.

In this case, sufficient memory is provided in the database 24 to store the raw data from twenty events i.e. ten low level and ten high level. Also for each record a single byte of memory is provided to store the time-stamp of that record. In accordance with explanations above, the memory available in the database 24 to store the raw data may typically be 3200 bytes. The database 24 may be dual-banked so that one bank can be updated during a minor time frame, whilst the data in the other bank is being transferred to the host computer 18. This means that for a total number of events of twenty, 128040 bytes of memory is available.

It will be noted that the input data to the PMD device 10 needs to be delayed sufficiently to allow for the latency through the peak detector 20. In fact the delay is typically slightly shorter than the latency to allow pre-trigger information to be stored in the database 24. The initiation of the data storage is a rising edge of a store data signal from the trigger module 22.

A plurality of registers 66 are available, the registers 66 being arranged to be set by the control logic 66. Table 1 generally shows a register set to be provided.

TABLE 1

Register set

| Register Number | Register Name | Size (bits) | No of Locations | Comment |
| --- | --- | --- | --- | --- |
| 0 | loTrigger | 7 | 1 | Low trigger level |
| 1 | hiTrigger | 7 | 1 | High trigger level |
| 2 | timeSlice | 8 | 1 | 80 μs time slice number |
| 3 | timer | 14 | 1 | Time within time slice to 5 ns resolution |
| 4 | inputSelect | 3 | 1 | Input selection |
| 5 | offset | 8 | 1 | Phase offset |
| 6 | Gpr | Tbd | 1 | General purpose register |

In an example embodiment, the host computer 18 is operable to modify the loTrigger, hiTrigger, inputSelect and offset registers. The other registers are typically set by the control logic 66 as previously mentioned.

The two trigger registers loTrigger and hiTrigger are used to set the trigger levels for the low level and high-level events. They will be set to the default values at power up of the PDM device 10.

The two timer registers timeSlice and timer holds the time at which the tenth low level event occurred in the current minor time frame, and are used to implement the required trigger hold off for the low level events.

The inputSelect register contains the number of the input to be monitored.

This offset register contains an offset between the zero crossing of the phase (either 1, 2 or 3 see FIG. 1) supplying the PDM device 10 and the phase being monitored. The value stored in this register is typically a number of clock cycles.

The gpr register provides a number of bits for controlling the firmware. For example:

Bit 0: Low trigger enable—when asserted the low level triggering will be enabled, Bit 1: Write SRAM—asserted when configuration data is to be written to SRAM 52, Bit 2: Write Flash—asserted when configuration data to be transferred from SRAM 52 to serial flash 46.

It will be noted now that the control logic 66 includes or is operable to control two timers which provide the time slice and the minor time frame times. Both timers are in the form of counters which are typically reset on the zero-crossing of the phase being monitored, i.e. the reset will occur at a time determined by the value in the offset register from the assertion of the zero-crossing input.

Regarding the timer for the time slice, for a system clock rate of 200 MHz a modulo-16000 counter is provided. It follows that for the timer for the minor time frame an 8-bit counter is provided to count the number of time slices that have occurred since the previous zero crossing. Each time the counter for the time slice overflows the minor time frame counter is correspondingly incremented.

The output of this counter is typically passed to the trigger module 22 to provide the time-stamp information for captured data.

For low-level events a trigger hold off is required so that in consecutive minor time frames the recording of low-level events can carry on from where the processing finished in the previous minor time frame. When a freeze input to the control logic 66 is asserted then the present values in the time slice counter and the minor time frame counter is stored in the timeSlice register and the timer register respectively (these registers were described above). Also the low-level trigger enable bit in the gpr shall be de-asserted.

During a minor time frame when the value in the time slice counter and the value in the minor time frame counter equal those held in the timeSlice and timer registers then the low-level trigger bit in the gpr is asserted.

In an example embodiment, the contents of the inputSelect register is decoded to assert one of six lines of a muxControl output from the processor 30.

As hereinbefore mentioned, at the end of a minor time frame the data stored in the database or data store 24 is transferred to the host computer 18 via the LAN interface 48.

The processor 30 also preferably includes a control interface 68. It follows that the control interface 68 provides the LAN MAC. The data transfer to the computer 18 is typically in the form of packets of information. The control interface 68 is therefore arranged to decode a data packet to provide the appropriate address of the register being accessed and the type of access to be carried out.

As mentioned previously with reference to FIG. 4, the PDM device 10 also includes a complex programmable logic device (CPLD) 54 which is communicatively coupled to the processor 30. It must me noted here that the CPLD 54 is treated as a write only register with a number of locations. The CPLD 54 also has components as modules as illustrated in FIG. 5. In particular, the CPLD 54 includes a processor interface 70 to provide an interface between the CPLD 54 and the processor 30. New data for the processor 30 program is typically received via the interface 70. Also, any required control signals generated within the processor 30 is received via this interface 70.

The CPLD 54 further includes a SRAM interface 72, as mentioned above the SRAM 52 (FIG. 4) provides a temporary store for the program data. The SRAM interface 72 therefore provides buffering for the data to be written to or read from the SRAM 52. Also the interface 72 provides the SRAM address and the read-write control.

A flash interface 74 is provided in the CPLD 54 to provide an interface to the serial FLASH memory 46 (FIG. 4) which is used to store the configuration data from the processor 30.

Lastly, the CPLD 54 includes as state machine 76 to control data flow both for storing data into the SRAM 52 and the transfer of data from the SRAM 52 to the serial FLASH memory 46. Typically, the state machine 76 is in an idle state were no actions are required. When new data is to be transferred the processor 30 issues a command to start the transfer of data from the processor 30. This data is typically stored in the SRAM 52 during the time that data is being transferred from the processor 30.

It will be appreciated that when all the data has been transferred the processor 30 issues a command to start the programming of the flash memory 46. During the programming phase, the data is read sequentially from the SRAM 52 and transferred to the flash memory 46 using a required protocol.

Figure 6:
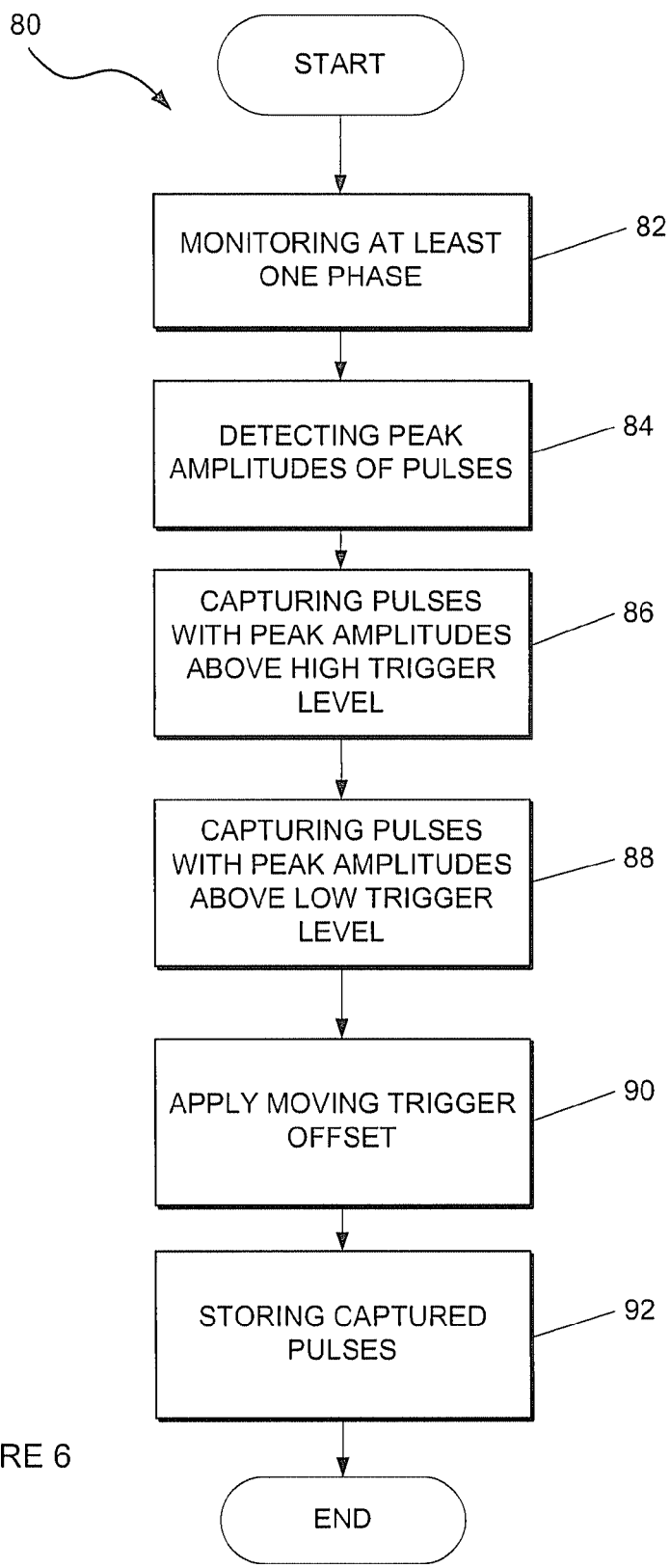
FIG. 6 shows a high level flow diagram of a method in accordance with an example embodiment

Example embodiments will now be further described in use with reference to FIG. 6. The example method shown in FIG. 6 is described with reference to FIGS. 1 to 5, although it is to be appreciated that the example methods may be applicable to other devices (not illustrated) as well.

Referring to FIG. 6 of the drawings, a flow diagram of a method in accordance with an example embodiment is generally indicated by reference numeral 80.

The method 80 includes monitoring, at block 82, at least one phase of the three phases of the electrical system 12 for occurrence of a pulse or pulse event. The PDM device 10 is typically arranged to monitor the system 12 by way of the sensors 16 as hereinbefore described.

The method 80 includes detecting, at block 84, peak amplitudes of pulses occurring in the electrical system 12 typically by way of the peak detector 20 as hereinbefore described.

It follows that the method 80 includes capturing, at block 86, all pulses which have peak amplitudes above the high trigger level. It will be appreciated that the trigger module 22 is arranged to capture the pulses in a fashion as previously described.

Similarly, the method 80 includes capturing, at block 86, a predetermined number of pulses which have peak amplitudes above the low trigger level by way of the trigger module 22.

The method 80 typically includes a step of comparing, by way of the trigger module 22, the detected peak amplitudes with high and low trigger levels in order to capture the pulses accordingly.

Lastly, the method 80 includes storing the captured pulses in the database or data store 24 in a similar fashion as hereinbefore described.

It will be noted that in example embodiments, the captured pulses may typically be identified as partial discharge pulses as the case may be. In this regard, the capturing of pulses based on their peak amplitudes provides a convenient way to identify partial discharge pulses occurring in the electrical system 12.

In an example embodiment, the method 80 further includes (not shown) applying a time trigger offset to the low trigger level. The method 80 may further include capturing pulses on a next cycle at the point at which the time trigger offset stopped on the previous cycle as explained in greater detail above.

Instead, or in addition, the method 80 comprises applying a moving time trigger offset. This may entail recording a time value within the minor time frame at which a pulse exceeds the low trigger level but not the high trigger level and the pulse number equals the predetermined number of pulses; ceasing capturing pulses exceeding the low trigger level but not the high trigger level until after this time value in a following minor time frame; and resetting the time value of the moving time trigger offset to zero and starting to capture pulses for the next minor time frame for pulses exceeding only the low trigger level after the moving time trigger offset value equals the value of the minor time frame.

The invention as hereinbefore described provides a convenient way to monitor partial discharges occurring in three-phase power systems. By using spectral analysis to identify partial discharges, undesirable outcomes associated with partial discharges may at least be mitigated or even circumvented.

The invention claimed is:

1. A method of monitoring partial discharges occurring in an electrical system, the method comprising:
    defining a low trigger level and a high trigger level, the low and the high trigger levels being amplitude levels for electrical pulses, wherein the high trigger level is a higher amplitude than the low trigger level;
    defining a minor time frame period;
    monitoring at least one phase of the electrical system for an occurrence of a pulse within the minor time frame;
    detecting a peak amplitude of a pulse occurring in the electrical system within the minor time frame;
    determining if the detected peak amplitude of the pulse exceeds the lower trigger level and/or the higher trigger level;
    assigning a pulse number to the pulse if the peak amplitude of the pulse exceeds the lower trigger level and/or the higher trigger level;
    capturing the pulse, or information associated therewith, if the pulse number associated with the pulse is less than a predetermined pulse number threshold in the minor time frame;
    applying a moving time trigger offset, such that:
        if a pulse exceeds the low trigger level but not the high trigger level and the pulse number equals a predetermined number of pulses then recording the time value within the minor time frame at which this occurs and ceasing to capture pulses exceeding the low trigger level but not the high trigger level until after this time value in a following minor time frame; and
        resetting the time value of the moving time trigger offset to zero and starting to capture pulses for the next minor time frame for pulses exceeding only the low trigger level after the moving time trigger offset value equals the value of the minor time frame; and
    storing the captured pulses in a memory device.

2. The method as claimed in claim 1, the method comprising selecting the pulse number threshold, the pulse number threshold being a maximum number of pulses to be captured in the minor time frame.

3. The method as claimed in claim 1, wherein assigning a pulse number to the pulse comprises incrementing a pulse number counter thereby to keep track of the number of pulses exceeding the lower trigger level and/or the higher trigger level in the minor time.

4. The method as claimed in claim 1, further comprising capturing pulses on a next cycle at a point at which the moving time trigger offset stopped on a previous cycle.

5. The method as claimed in claim 1, the method comprising capturing pulses, or information associated therewith, as low-level events or high-level events, wherein low-level events is deemed to occur if the peak amplitude of the pulse exceeds the lower trigger level but not the higher trigger level and wherein the high-level event is deemed to occur if the peak amplitude of pulse exceeds both low and high trigger levels respectively.

6. The method as claimed claim 1, the method comprising:
    starting a timer and storing a peak amplitude and sign of a previous pulse if a peak amplitude of a current pulse at a sample point falls below that of a previous sample; and
    resetting the timer and starting a new timeslice period, if during a timeout period, the peak amplitude of a current pulse is greater than the stored peak amplitude of the previous pulse.

7. A device for monitoring partial discharges occurring in a three phase electrical system, the device comprising:
    a peak detector for detecting peak amplitudes of pulses occurring in the electrical system;
    a trigger module arranged to:
        determine if the detected peak amplitude of the pulse exceeds a lower trigger level and/or the higher trigger level, the low and the high trigger levels being amplitude levels for electrical pulses, wherein the high trigger level is a higher amplitude than the low trigger level;
        assign a pulse number to the pulse if the peak amplitude of the pulse exceeds the lower trigger level and/or the higher trigger level;
        capture the pulse, or information associated therewith, if the pulse number associated with the pulse is less than a predetermined pulse number threshold in a minor time frame and;
    a database in which a plurality of pulses, or information associated therewith, captured by the trigger module is stored.

8. The device as claimed in claim 7, wherein the device comprises a processor arranged at least to apply a moving time trigger offset.

9. The device as claimed in claim 8, wherein the processor is configured to:
    record a time value within the minor time frame at which the peak amplitude of the pulse exceeds the low trigger level but not the high trigger level and the pulse number equals the predetermined pulse number threshold;
    cease capturing pulses, or information associated therewith, for those pulses with peak amplitudes exceeding the low trigger level but not the high trigger level until after the time value in a following minor time frame; and
    reset the time value of the moving time trigger offset to zero and capturing pulses for the next minor time frame for pulses having peak amplitudes exceeding only the low trigger level after the moving time trigger offset value equals the value of the minor time frame.

10. The device as claimed in claim 7, the device comprising a co-ordinate converting module arranged to convert a vector from Cartesian co-ordinates to polar co-ordinates.

* * * * *